United States Patent [19]
Park et al.

[11] Patent Number: 6,077,772
[45] Date of Patent: Jun. 20, 2000

[54] METHODS OF FORMING METAL INTERCONNECTIONS INCLUDING THERMALLY TREATED BARRIER LAYERS

[75] Inventors: In-Seon Park, Seoul; Sung-Tae Kim; Du-Hwan Lee, both of Kyungki-do; Won-Goo Hur, Seoul, all of Rep. of Korea

[73] Assignee: Samsung Electronics Co., Ltd., Rep. of Korea

[21] Appl. No.: 09/270,174

[22] Filed: Mar. 16, 1999

[30] Foreign Application Priority Data

May 11, 1998 [KR] Rep. of Korea ............... 98-16746

[51] Int. Cl.⁷ .................................. H01L 21/4763
[52] U.S. Cl. .................... 438/627; 438/637; 438/643; 438/644; 438/653; 438/622; 257/751; 257/750
[58] Field of Search .............................. 438/627, 643, 438/644, 653, 632, 622, 637, 648, 629, 663; 257/764, 915, 751, 750

[56] References Cited

U.S. PATENT DOCUMENTS

| | | | |
|---|---|---|---|
| 4,715,937 | 12/1987 | Moslehi et al. ..................... | 204/177 |
| 5,202,579 | 4/1993 | Fujii et al. ........................... | 257/751 |
| 5,514,908 | 5/1996 | Liao et al. ............................ | 257/751 |
| 5,677,238 | 10/1997 | Gn et al. ............................. | 438/643 |
| 5,956,609 | 9/1999 | Lee et al. ............................. | 438/648 |
| 5,960,317 | 9/1999 | Jeong .................................. | 438/633 |

*Primary Examiner*—Charles Bowers
*Assistant Examiner*—Hsien-Ming Lee
*Attorney, Agent, or Firm*—Myers Bigel Sibley & Sajovec

[57] ABSTRACT

A method of forming a metal interconnection includes the steps of forming a first conductive layer on a substrate, and forming an insulating layer on the first conductive layer and on the substrate. A contact hole is formed in the insulating layer thereby exposing a portion of the first conductive layer, a barrier layer is formed on the exposed portion of the first conductive layer in the contact hole, and a thermal treatment is performed on the barrier layer. After the step of performing the thermal treatment, a wetting layer is formed on a sidewall of the contact hole, and a second conductive layer is formed on the barrier layer and on the wetting layer in the contact hole.

16 Claims, 5 Drawing Sheets

US 6,077,772

METHODS OF FORMING METAL INTERCONNECTIONS INCLUDING THERMALLY TREATED BARRIER LAYERS

FIELD OF THE INVENTION

The present invention relates to the field of electronics, and more particularly to methods of forming metal interconnections for electronic devices.

BACKGROUND OF THE INVENTION

As integrated circuit semiconductor devices become more highly integrated, aspect ratios for contact holes used to interconnect conductive layers may increase. In other words, the ratio of a depth of the contact hole to a diameter of a contact hole increases. Accordingly, a metal providing a high degree of step coverage may be required to fill the contact hole to provide conductive interconnection between metal layers on opposite sides of the contact hole.

Accordingly, tungsten layers formed using chemical vapor deposition (CVD) and providing a high degree of step coverage have been used to provide metal interconnections. Such a tungsten layer can reduce the formation of voids in the contact hole.

FIG. 1A is a cross sectional view illustrating a metal interconnection according to the prior art including tungsten and aluminum interconnection layers connected through a contact hole. As shown, an insulating layer 12 is formed on a semiconductor substrate 10, and a tungsten interconnection layer 18 is formed on the insulating layer 12. Moreover, a conductive layer 16 including titanium nitride (TiN) and titanium (Ti) can be formed between the insulating layer 12 and the tungsten interconnection layer 18. A second insulating layer 14 is formed on the first insulating layer 12 and on the tungsten interconnection layer 18.

A contact hole is then formed in the second insulating layer 14 using photolithography and etch steps thereby exposing a portion of the tungsten interconnection layer 18. In particular, a dry etch can be used to provide a contact hole having a relatively high aspect ratio. A wetting layer 20 and an aluminum interconnection layer 22 are then formed on the second insulating layer 14 and on the exposed portion of the tungsten interconnection layer 18.

A subsequent thermal treatment may then be used to reflow the aluminum interconnection layer 22. The aluminum interconnection layer 22 and the tungsten interconnection layer 18, however, may react during this thermal treatment so that the volume of the tungsten interconnection layer 18 is reduced. In other words, the aluminum interconnection layer 22 and the tungsten interconnection layer 18 may react to form alloy regions 24a and 24b thereby reducing the portion of the tungsten interconnection layer 18 remaining. Because the alloy may have a higher resistance than that of tungsten, the resistance of the tungsten interconnection layer 18 may be increased.

FIGS. 1B, 1C, 1D, and 1E graphically illustrate EDX ingredient analysis in regions W, H, C, and F of FIG. 1A. As shown in FIG. 1B, there is no significant peak other than the peak of tungsten (W) for the region W of FIG. 1A. Accordingly, the alloy of tungsten and aluminum is not generated in region W. In FIGS. 1C, 1D, and 1E, however, there are aluminum peaks in addition to the tungsten peaks indicating that alloys of aluminum and tungsten are generated in regions H, C, and F of FIG. 1A. Accordingly, there continues to exist a need in the art for methods of forming metal interconnections with reduced alloy formation.

SUMMARY OF THE INVENTION

It is therefore an object of the present invention to provide improved methods of forming metal interconnections.

It is another object of the present invention to provide methods of forming metal interconnections having reduced resistance.

It is still another object of the present invention to provide methods of forming metal interconnections having reduced voids.

It is yet another object of the present invention to provide methods of forming metal interconnections having reduced reactions between different interconnection layers.

These and other objects are provided according to the present invention by methods including the steps of forming a first conductive layer on a substrate, forming an insulating layer on the first conductive layer and on the substrate, and forming a contact hole in the insulating layer thereby exposing a portion of the first conductive layer. A barrier layer is formed on the exposed portion of the first conductive layer in the contact hole, and a thermal treatment is performed on the barrier layer. After the step of performing the thermal treatment, a wetting layer is formed on a sidewall of the contact hole, and a second conductive layer is formed on the barrier layer and on the wetting layer filling the contact hole.

The barrier layer is thus densified during the thermal treatment before the formation of the second conductive layer. Accordingly, reactions between the first and second conductive layers can be reduced when the second conductive layer is subjected to a subsequent reflow thermal treatment.

More particularly, the step of performing the thermal treatment can include heating the barrier layer to a temperature in the range of about 400 degrees C to about 600 degrees C, and this thermal treatment can have a duration of about 45 minutes. Alternately, the step of performing the thermal treatment can include heating the barrier layer to a temperature in the range of about 600 degrees C to about 700 degrees C, and this thermal treatment can have a duration of about 20 seconds. Moreover, the thermal treatment can be a rapid thermal nitridation or a furnace thermal treatment.

The first conductive layer can include a layer of tungsten, and the barrier layer can include a layer of titanium and/or a layer of titanium nitride. The thermally treated barrier layer can have a thickness of about 150 angstroms or less on the exposed portion of the first conductive layer, and the wetting layer can include a layer of titanium nitride and/or a layer of titanium. the wetting layer can have a thickness in the range of about 30 Angstroms to about 100 Angstroms on the sidewall of the contact hole.

According to an alternate aspect of the present invention, a method of forming metal interconnections includes forming a first conductive layer on a substrate, forming an insulating layer on the first conductive layer and on the substrate, and forming a contact hole in the insulating layer thereby exposing a portion of the first conductive layer. A barrier layer is formed on a sidewall of the contact hole and on the exposed portion of the first conductive layer wherein the barrier layer has a thickness of at least about 150 Angstroms, and a second conductive layer is formed on the barrier layer. In this aspect of the invention, the thickness of the barrier layer is sufficient to reduce reactions between the first and second conductive layers during subsequent reflow thermal operations.

The methods of the present invention thus provide conductive interconnection layers connected via contact holes wherein reactions between the interconnection layers are reduced. Accordingly, resistance of the interconnection layers and voids therein can be reduced.

DETAILED DESCRIPTION

Figure 1A:
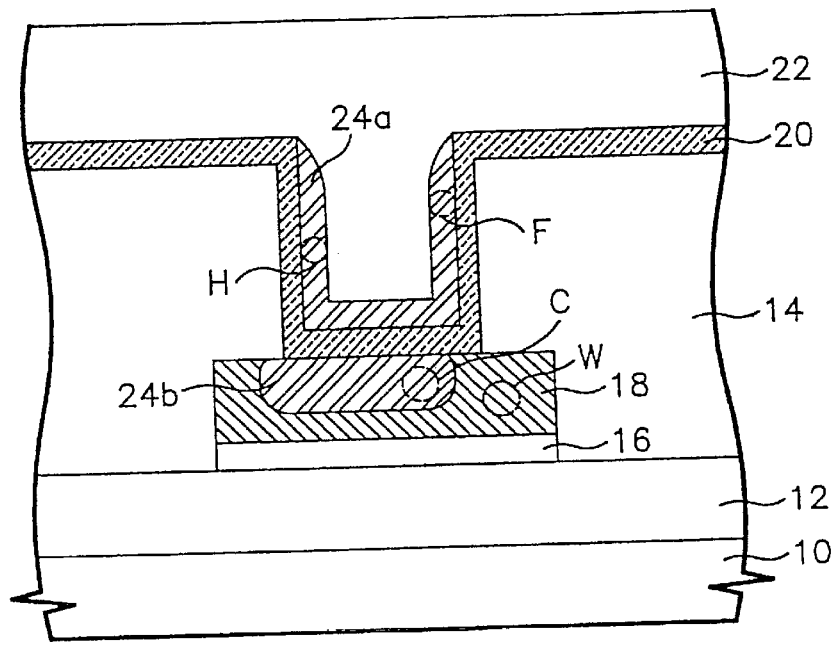
FIG. 1A is a cross sectional view illustrating a semiconductor device including metal interconnections according to the prior art.
Figure 1B:
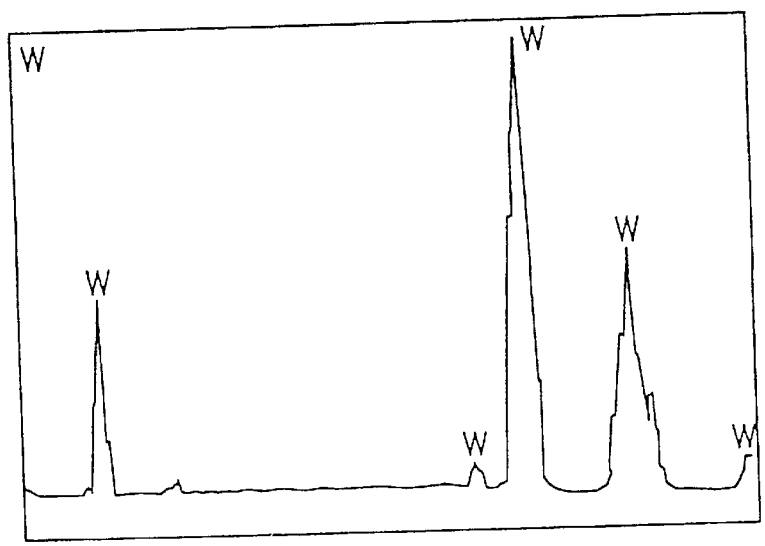
FIGS. 1B–E are graphs illustrating EDX ingredient analysis for regions H, F, C, and W of FIG. 1A.
Figure 1C:
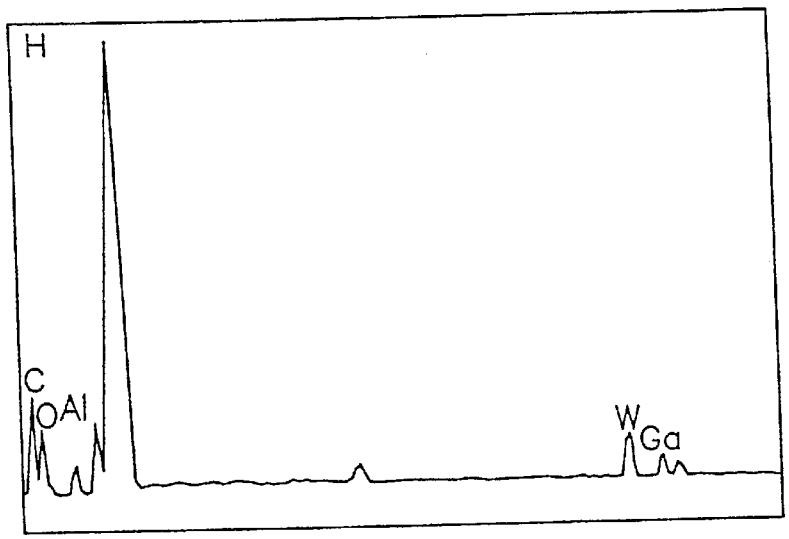
Figure 1D:
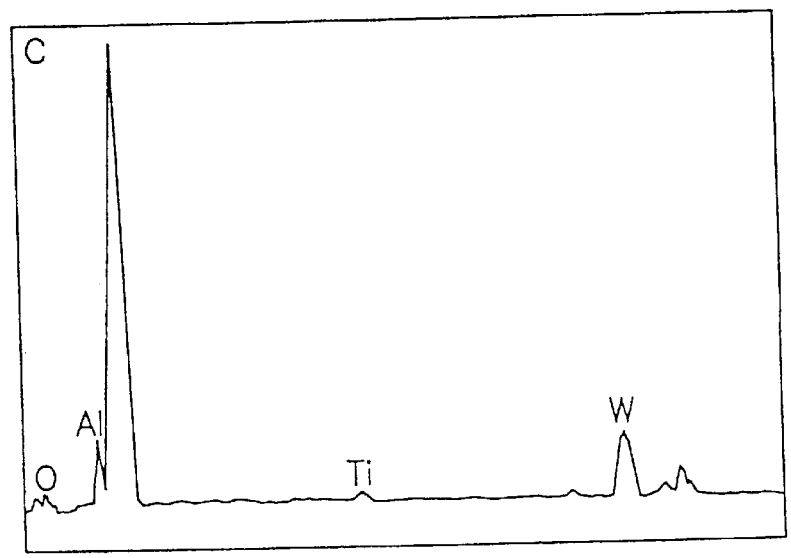
Figure 1E:
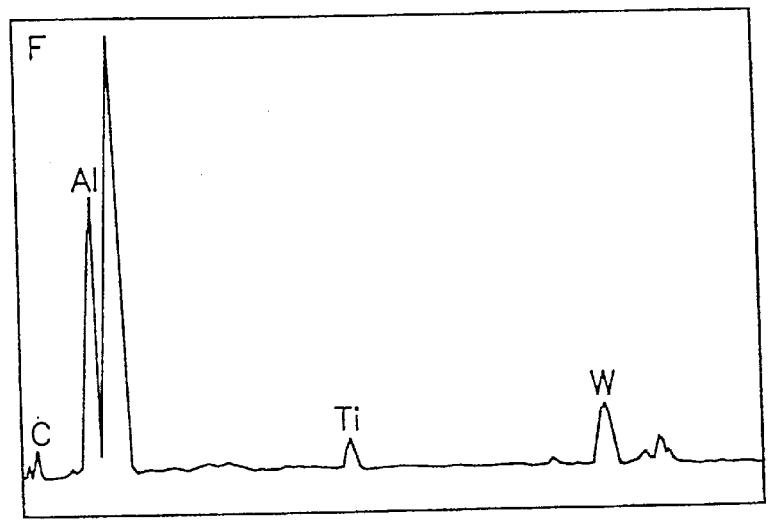

The present invention will now be described more fully hereinafter with reference to the accompanying drawings, in which preferred embodiments of the invention are shown. This invention disclosure may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of the layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2A:
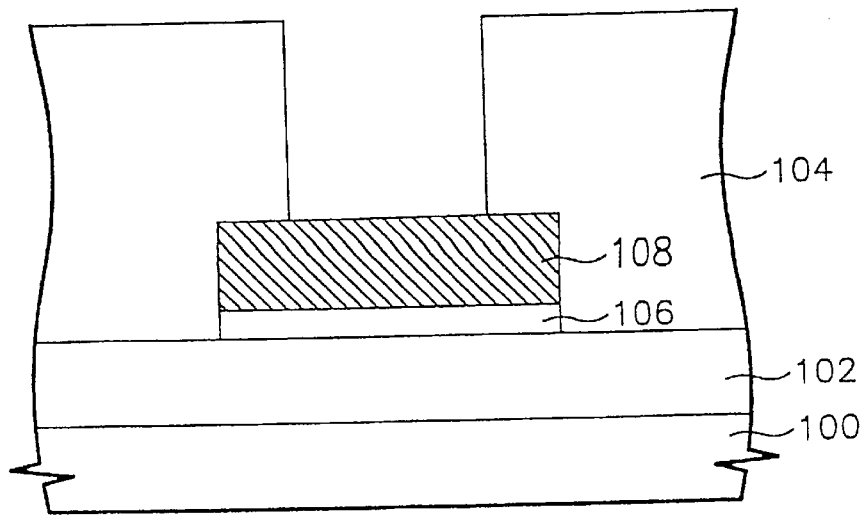
FIGS. 2A–2C are cross sectional views illustrating steps of a first method of forming semiconductor devices including metal interconnections according to the present invention.

A first embodiment of the invention will now be described with reference to FIGS. 2A, 2B, and 2C. As shown in FIG. 2A, a first insulating layer 102 is formed on an integrated circuit substrate such as a semiconductor substrate 100. A tungsten interconnection layer 108 is formed on the first insulating layer 102, and a layer 106 comprising titanium (Ti) and titanium nitride (TiN) layers can be provided between the first insulating layer 102 and the tungsten interconnection layer 108. A second insulating layer 104 is then formed on the tungsten interconnection layer 108 and the first insulating layer 102.

A contact hole is then formed in the second insulating layer 104 thereby exposing a portion of the tungsten interconnection layer 108. The contact hole can be formed using known photolithography and etching steps wherein a patterned photoresist layer is formed on the second insulating layer 104 and used as an etching mask. After forming the contact hole, the photoresist etching mask is removed.

Figure 2B:
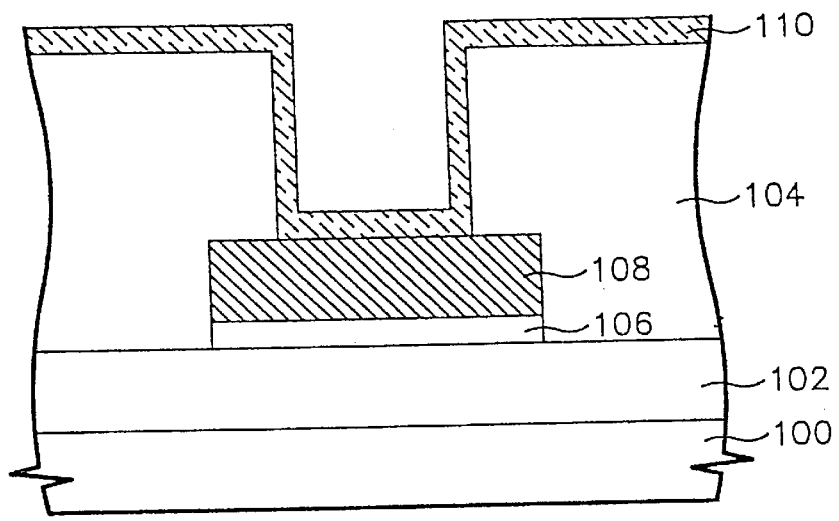

A barrier layer 110 is then formed on the second insulating layer 104 and on the exposed portion of the tungsten interconnection layer 108 as shown in FIG. 2B. The barrier layer 110 can include a titanium nitride layer or a combination of a titanium nitride layer and a titanium layer. As shown, the barrier layer 110 covers the exposed portion of the tungsten interconnection layer 108 and the sidewalls of the contact hole. The barrier layer 110 is used to reduce reactions between the tungsten interconnection layer 108 and a subsequently formed aluminum interconnection layer 114 thereby reducing the undesired formation of tungsten-aluminum alloys.

A thermal treatment is then performed to densify the barrier layer 110. While this thermal treatment may reduce the wetting quality of the barrier layer 110, the ability of the barrier layer 110 to reduce reactions between the tungsten layer 108 and the subsequently formed aluminum layer 114 may be enhanced. The thermal treatment of the barrier layer 110 can be performed using a rapid thermal nitridation (RTN) or a thermal treatment in a furnace. The thermal treatment in the furnace can be performed at a temperature in the range of about 400 degrees C to about 600 degrees C for about 45 minutes. The rapid thermal nitridation (RTN) can be performed at a temperature in the range of about 600 degrees C to about 700 degrees C for about 20 seconds.

Figure 2C:
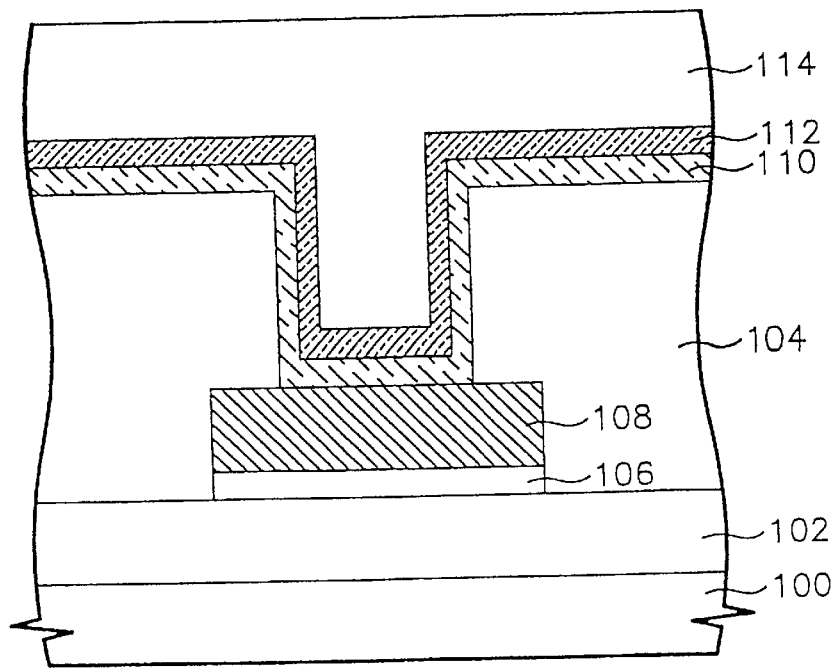

According to the embodiment illustrated in FIGS. 2A–2C, a titanium nitride (TiN) barrier layer 110 can be formed on the exposed portion of the tungsten interconnection layer 108 and on the sidewalls of the contact hole. Alternately, the titanium nitride barrier layer 110 can be formed on the exposed portion of the tungsten interconnection layer 108 but not on the sidewalls of the contact hole. In either case, the barrier layer 110 is densified using the thermal treatment so that reactions between a subsequently formed aluminum interconnection layer 114 on the barrier layer 110 and the tungsten interconnection layer 108 can be reduced.

Because the wetting quality of the barrier layer 110 may be reduced as a result of the thermal treatment (and resulting densification thereof), a wetting layer 112 may be formed on the densified barrier layer 110. The wetting layer 112 can be a layer of titanium (Ti) or a layer of titanium nitride (TiN). Of these two materials, a layer of titanium may provide better wetting qualities while a layer of titanium nitride (TiN) may provide better barrier qualities.

The wetting layer preferably has a thickness in the range of about 30 Angstroms to about 100 Angstroms on the sidewalls of the contact hole. As shown in FIG. 2C, the wetting layer 112 can be formed on the barrier layer 110 opposite the exposed portion of the tungsten interconnection layer 108 and opposite the sidewalls of the contact hole. Alternately, the wetting layer 112 can be provided only on portions of the barrier layer 110 opposite the sidewalls of the contact hole. Furthermore, the barrier layer can be provided only on the exposed portions of the tungsten interconnection layer and the wetting layer can be provided only on sidewalls of the contact hole. The wetting layer 112 provides wetting during the reflow of a subsequently formed aluminum interconnection layer.

An aluminum interconnection layer 114 is then formed on the wetting layer 112 in the contact hole. A thermal treatment is used to reflow the aluminum interconnection layer 114 to provide a more complete filling of the contact hole. The thermal treatment used to provide aluminum reflow can be performed at a temperature in the range of about 450 degrees C to about 550 degrees C. Another thermal treatment can be performed at a temperature in the range of about 400 degrees C to about 450 degrees C to improve the capacity of a semiconductor device such as a transistor.

Figure 3A:
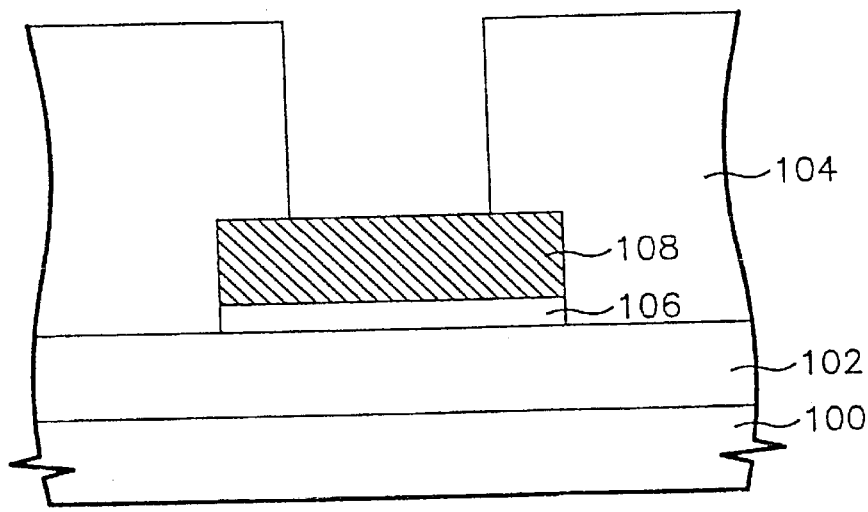
FIGS. 3A–3B are cross sectional views illustrating steps of a second method of forming semiconductor devices including metal interconnections according to the present invention.

A second embodiment of the present invention will now be discussed with reference to FIGS. 3A and 3B. As shown in FIG. 3A, a first insulating layer 102 is formed on an integrated circuit substrate such as a semiconductor substrate 100. A layer 106 including titanium nitride (TiN) and titanium (Ti) layers can be formed on the first insulating layer 102, and a tungsten interconnection layer 108 is formed on the layer 106. A second insulating layer 104 is formed on the tungsten interconnection layer 108 and on the first insulating layer 102.

A contact hole is then formed in the second insulating layer 104 thereby exposing a portion of the tungsten interconnection layer 108. The contact hole can be formed using known photolithography and etching steps wherein a patterned photoresist layer is used as an etching mask.

Figure 3B:
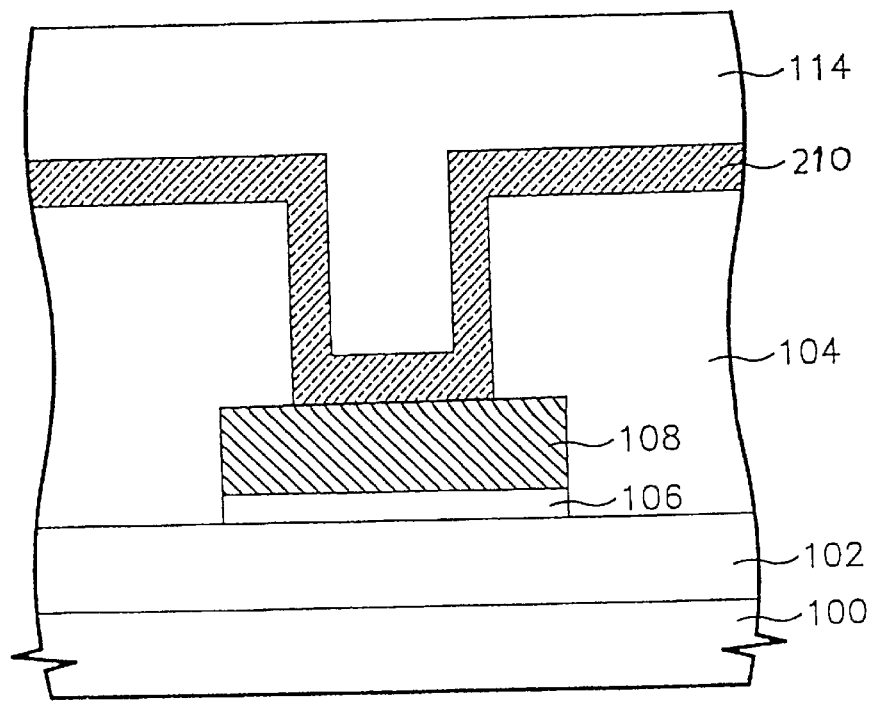

A barrier/wetting layer 210 is formed on the second insulating layer 104 and on the exposed portion of the tungsten interconnection layer 108 as shown in FIG. 3B. The barrier/wetting layer 210 can be a layer of titanium nitride (TiN) or a multi-layer including a titanium nitride (TiN) layer and a titanium (Ti) layer. The barrier/wetting layer 210 preferably has a thickness of at least about 150 Angstroms on the exposed portion of the tungsten layer 108. Accordingly, the barrier/wetting layer 210 can act as both a wetting layer and a barrier layer during the reflow of a subsequently formed aluminum interconnection layer 114 thereon. Because the barrier/wetting layer 210 is not subjected to the thermal treatment discussed above with regard to FIGS. 2A–2C, the wetting quality of the layer is maintained. Furthermore, the thickness of this barrier/wetting layer 210 is sufficient to prevent significant reaction between the tungsten interconnection layer 108 and the subsequently formed aluminum interconnection layer 114 during reflow of the aluminum interconnection layer 114. Accordingly, the formation of tungsten-aluminum alloys can be reduced.

The aluminum interconnection layer 114 is formed on the barrier/wetting layer 210 to fill the contact hole. A thermal treatment is used to reflow the aluminum interconnection layer 114 to provide a more complete filling of the contact hole. The reflow thermal treatment can be the same as that discussed above with regard to FIGS. 2A–2C.

The methods of the present invention can thus provide improved via connections between tungsten and aluminum interconnection layers. In particular, reactions between the aluminum and tungsten interconnection layers can be reduced when the aluminum interconnection layer is subjected to a reflow thermal treatment so that the formation of aluminum-tungsten alloys can be reduced. Alloy formation may otherwise reduce the volume of the tungsten interconnection layer resulting in voids and increased resistance.

According to the present invention, a barrier layer between the tungsten and aluminum interconnection layer can be densified using a thermal treatment before deposition of the aluminum interconnection layer to reduce reaction between the aluminum and tungsten interconnection layers. Alternately, a sufficiently thick (approximately 150 Angstroms or more) barrier/wetting layer can be used to reduce undesired reactions between the aluminum and tungsten interconnection layers.

In the drawings and specification, there have been disclosed typical preferred embodiments of the invention, and although specific terms are employed, they are used in a generic sense only and not for purposes of limitation, the scope of the invention being set forth in the following claims.

That which is claimed:

1. A method of forming a metal interconnection, said method comprising the steps of:

forming a first conductive metal layer on a substrate;

forming an insulating layer on the first conductive metal layer and on the substrate wherein the insulating layer includes a contact hole therein exposing a portion of the first conductive metal layer;

forming a barrier layer on the exposed portion of the first conductive metal layer in the contact hole wherein the barrier layer comprises titanium;

performing a thermal treatment on the barrier layer comprising titanium;

after the step of performing the thermal treatment, forming a wetting layer on a sidewall of the contact hole; and forming a second conductive metal layer on the barrier layer and on the wetting layer in the contact hole wherein the wetting layer comprises a material different than the second conductive metal layer.

2. A method according to claim 1 wherein the step of performing the thermal treatment comprises heating the barrier layer to a temperature in the range of about 400 degrees C to about 600 degrees C.

3. A method according to claim 2 wherein the barrier layer is heated to the temperature in the range of about 400 degrees C to about 600 degrees C for about 45 minutes.

4. A method according to claim 1 wherein the step of performing the thermal treatment comprises heating the barrier layer to a temperature in the range of about 600 degrees C to about 700 degrees C.

5. A method according to claim 4 wherein the barrier layer is heated to the temperature in the range of about 400 degrees C to about 600 degrees C for about 20 seconds.

6. A method according to claim 4 wherein the step of performing the thermal treatment comprises a rapid thermal nitridation (RTN).

7. A method according to claim 1 wherein the step of performing the thermal treatment comprises one of a rapid thermal nitridation (RTN) and a furnace thermal treatment.

8. A method according to claim 1 wherein the first conductive metal layer comprises tungsten.

9. A method according to claim 1 wherein the barrier layer comprises titanium nitride (TiN).

10. A method according to claim 1 wherein the barrier layer comprises a layer of titanium (Ti) and a layer of titanium nitride (TiN).

11. A method according to claim 1 wherein the wetting layer comprises a material selected from the group consisting of titanium nitride (TiN) and titanium (Ti).

12. A method according to claim 1 wherein the barrier layer has a thickness of about 150 Angstroms or less on the exposed portion of the first conductive layer.

13. A method according to claim 1 wherein the wetting layer has a thickness in the range of about 30 Angstroms to about 100 Angstroms on the sidewall of the contact hole.

14. A method according to claim 1 wherein the step of performing the thermal treatment comprises densifying the barrier layer.

15. A method according to claim 1 further comprising the step of:

after the step of forming the second conductive metal layer, performing a second thermal treatment to reflow the second conductive metal layer.

16. A method according to claim 1 wherein the second conductive metal layer comprises aluminum.

* * * * *